United States Patent
Kano et al.

Patent Number: 5,148,120
Date of Patent: Sep. 15, 1992

[54] CLASS-AB PUSH-PULL DRIVE CIRCUIT

[75] Inventors: Kenji Kano; Yusuke Yamada; Masao Arimoto, all of Itami; Shoji Uehata, Kawanishi, all of Japan

[73] Assignee: Mitsubishi Denki Kabushiki Kaisha, Tokyo, Japan

[21] Appl. No.: 717,060

[22] Filed: Jun. 18, 1991

[30] Foreign Application Priority Data

Jul. 16, 1990 [JP] Japan .................. 2-189908

[51] Int. Cl.$^5$ ............................... H03F 3/26
[52] U.S. Cl. ........................ 330/264; 330/267
[58] Field of Search ............ 330/263, 264, 267, 268, 330/277, 288, 296

[56] References Cited

U.S. PATENT DOCUMENTS

4,570,128  2/1986  Monticelli ............... 330/267
5,057,789  10/1991  Nugaraj .................. 330/264

OTHER PUBLICATIONS

"Bipolar and MOS Analog Integrated Circuit Design", by Alan B. Grebene, pp. 295–298.

"The Linear Circuits Data Book 1985", by Texas Instruments, pp. 6–19.

*Primary Examiner*—Steven Mottola
*Attorney, Agent, or Firm*—Oblon, Spivak, McClelland, Maier & Neustadt

[57] ABSTRACT

A class-AB push-pull drive circuit comprises a P channel MOS transistor having a source connected with a DC power source, a drain connected with an output terminal and a control electrode coupled with an input terminal through a voltage-to-current converter and a current-to-voltage converter and an N channel MOS transistor having a source grounded, a drain connected with the output terminal and a control electrode coupled with the input terminal. Conversion characteristics of the converters are so set that a potential difference between the control electrodes of the transistors is kept constant independently of the voltage of an input signal. Thus, the rise and fall of voltage at the output terminal during the conducting state of respective transistors is decreased. In addition, a push-pull drive operation by the transistors can be achieved in accordance with the input signal.

10 Claims, 3 Drawing Sheets

CLASS-AB PUSH-PULL DRIVE CIRCUIT

BACKGROUND OF THE INVENTION

1. Field of the Invention

The present invention relates to a class-AB push-pull drive circuit used for an audio circuit and the like and more particularly to the expansion of an operating range of an output voltage thereof.

2. Description of the Prior Art

FIG. 3 is a circuit diagram showing a conventional push-pull drive circuit. As shown in FIG. 3, an input terminal 1 is connected to the gate of an N channel MOS transistor $Q_{10}$. The source of the transistor $Q_{10}$ is grounded, and the drain thereof is connected to the gate of a P channel MOS transistor $Q_1$ and to the drain of a P channel MOS transistor $Q_9$ in which the gate and the drain are connected in common. The source of the transistor $Q_9$ is connected to the source of an N channel MOS transistor $Q_8$. The drain of the transistor $Q_8$ is connected to the gate of an N channel MOS transistor $Q_2$ and to one end of a resistor $R_3$. The and gate of trasistor $Q_8$ is connected to the other end of the resistor $R_3$. The other end of the resistor $R_3$ is connected through a constant current source $I_4$ to the positive side of a DC power source 3. The negative side of the DC power source 3 is grounded. The source of the transistor $Q_1$ is connected to an output terminal 2, and the drain thereof is grounded. The source of the transistor $Q_2$ is connected to the output terminal 2, and the drain thereof is connected to the positive side of the DC power source 3.

If a gate-source voltage of the transistor $Q_8$ is designated by $V_{GS8}$, a gate-source voltage of the transistor $Q_9$ by $V_{GS9}$, drain currents of the transistors $Q_8$ and $Q_9$ by $I_{B4}$, a gate-source voltage of the transistor $Q_2$ by $V_{GS2}$, a drain current thereof by $I_{D2}$, a gate-source voltage of the transistor $Q_1$ by $V_{GS1}$, and a drain current thereof by $I_{D1}$, the following equations hold:

$$I_{B4} = \frac{\beta_8}{2} (V_{GS8} - V_{THON})^2 \quad (1)$$

$$I_{B4} = \frac{\beta_9}{2} (V_{GS9} - V_{THOP})^2 \quad (2)$$

$$I_{D2} = \frac{\beta_2}{2} (V_{GS2} - V_{THON})^2 \quad (3)$$

$$I_{D1} = \frac{\beta_1}{2} (V_{GS1} - V_{THOP})^2 \quad (4)$$

where $\beta_8$ is a constant determined by the configuration of the transistor $Q_8$, $\beta_9$ is a constant determined by the configuration of the transistor $Q_9$, $\beta_2$ is a constant determined by the configuration of the transistor $Q_2$, $\beta_1$ is a constant determined by the configuration of the transistor $Q_1$, $V_{THON}$ is a threshold voltage of the N channel transistors, and $V_{THOP}$ is a threshold voltage of the P channel transistors.

With respect to a potential difference between the gate of the transistor $Q_2$ and the gate of the transistor $Q_3$, the following equation holds:

$$V_{GS2} + V_{GS1} = V_{GS8} + V_{GS9} - R_3 I_{B4} \quad (5)$$

where $R_3$ is a resistance value of the resistor $R_3$, and $I_{B4}$ is a bias current from the constant current source $I_4$.

As is obvious from the equations (5), (1) and (2), the potential difference between the gates of the transistors $Q_1$ and $Q_2$ can be held constant by setting $R_3$ and $I_{B4}$ appropriately.

When the equations (1), (2), (3) and (4) are substituted in the equation (5), the following equation holds:

$$\sqrt{\frac{2I_{D2}}{\beta_2}} + \sqrt{\frac{2I_{D1}}{\beta_1}} = \sqrt{\frac{2I_{B4}}{\beta_8}} + \sqrt{\frac{2I_{B4}}{\beta_9}} - R_3 I_{B4} \quad (6)$$

where $I_{B3}$ is a constant bias current supplied from a constant current source $I_3$. The value on the right side of the equation (6) is constant independently of the drain currents $I_{D1}$ and $I_{D2}$ of the transistors $Q_1$ and $Q_2$ in an output stage. Accordingly, it can be expressed as follows:

$$\sqrt{\frac{2I_{D2}}{\beta_2}} + \sqrt{\frac{2I_{D1}}{\beta_1}} = \text{const.} \quad (7)$$

If the current which flows from the drain of the transistor $Q_2$ to the drain of the transistor $Q_1$, while no load current is present in the output terminal 2, is designated by $I_{idle}$, $I_{idle} = I_{D1} = I_{D2}$ the following equation holds:

$$I_{idle} = \left( \frac{\sqrt{\frac{2I_{B4}}{\beta_8}} + \sqrt{\frac{2I_{B4}}{\beta_9}} - R_3 I_{B4}}{\sqrt{\frac{2}{\beta_2}} + \sqrt{\frac{2}{\beta_1}}} \right)^2 \quad (8)$$

This current value can be held sufficiently small by increasing the resistance value $R_3$.

When load is connected to the output terminal 2 and an outflow current $I_{source}$ is present, the gate-source voltage $V_{GS2}$ of the transistor $Q_2$ is increased. In such a case, because the voltage between the gates of the transistors $Q_1$ and $Q_2$ is constant as expressed by the equation (5), the gate-source voltage $V_{GS1}$ of the transistor $Q_1$ is decreased and, as a result, the drain current $I_{D1}$ of the transistor $Q_1$ is decreased.

In this state, if the drain current $I_{D1}$ of the transistor $Q_1$ is disregarded, an increasable maximum voltage $V_{2max}$ of the output terminal 2 can be found by the following equations:

$$V_{2max} = E - V_{GS2} - R_3 I_{B4} \quad (9)$$

$$= E - \sqrt{\frac{2I_{source}}{\beta_2}} - V_{THON} - R_3 I_{B4} \quad (10)$$

where E is a voltage value of the DC power source 3.

In a normal enhancement CMOS structure, $V_{THON}$ is about 0.8V. For sufficient current flow in the transistor $Q_2$, $\sqrt{2I_{source}/\beta_2}$ must be about 0.5 V. According to the equation (10), the increasable maximum voltage $V_{2max}$ of the output terminal 2 is less than the voltage value obtained by subtracting 1.3 V from the source voltage E.

When a load is connected to the output terminal 2 and an inflow current $I_{sink}$ is present, the gate-source voltage $V_{GS1}$ of the transistor $Q_1$ is increased. Also in this case, because the voltage between the gates of the transistors $Q_2$ and $Q_1$ is constant as expressed by the equation (5), the gate-source voltage $V_{GS2}$ of the transistor $Q_2$ is decreased and, as a result, the drain current $I_{D2}$ of the transistor $Q_2$ is decreased.

In this state, if the drain current $I_{D2}$ of the transistor $Q_2$ is disregarded, an decreasable minimum voltage $V_{2min}$ of the output terminal 2 can be found by the following equations:

$$V_{2min} = V_{GS1} \tag{11}$$

$$= \sqrt{\frac{2I_{sink}}{\beta_1}} + V_{THOP} \tag{12}$$

In the normal enhancement CMOS structure, $V_{THOP}$ is about 0.8 V. For sufficient current flow in the transistor $Q_1$, $\sqrt{2I_{sink}/\beta_1}$ must be about 0.5 V. According to the equation (12), the decreasable minimum voltage $V_{2min}$ of the output terminal 2 is more than 1.3 V.

In the conventional class-AB push-pull drive circuit as constructed above, the attainable maximum and minimum output voltages from the output terminal 2 are $(E-1.3)V$ and 1.3 V respectively, and therefore there has been a problem that the operating range of the output voltage is narrow.

SUMMARY OF THE INVENTION

According to the present invention, a class-AB push-pull drive circuit comprises first and second power terminals for applying different first and second power potentials, respectively. Input and output terminals are supplied with input and output signals, respectively, and a first transistor is provided, having one electrode connected to the output terminal, another electrode connected to the first power terminal, and a control electrode coupled to the input terminal and supplied with a the voltage corresponding to voltage of the input signal. Conduction of the first transistor is controlled in accordance with a potential difference between the control electrode thereof and the other electrode thereof. A second transistor opposite in polarity to the first transistor, having one electrode connected to the output terminal, and another electrode connected to the second power terminal. Conduction of the second transistor is controlled in accordance with a potential difference between a control electrode thereof and the other electrode thereof. A voltage-to-current converter is coupled to the input terminal for generating current corresponding to the voltage of the input signal, and a current-to-voltage converter is connected between an output of the voltage-to-current converter and the control electrode of the second transistor for converting the current into voltage to supply the voltage to the control electrode of the second transistor. Conversion characteristics of the voltage-to-current converter and the current-to-voltage converter are established so that a potential difference between the control electrodes of the first and second transistors is held constant independently of the voltage of the input signal.

The first and second transistors according to the present invention are opposite in polarity to each other. The conduction of the transistors is controlled in accordance with the potential difference between the control electrodes and the other electrodes, respectively. The respective other electrodes thereof are connected to the first and second power terminals. Therefore, the rise and fall of voltage at the output terminal during the respective conducting states of the first and second transistors is reduced. Furthermore, the conversion characteristics of the voltage-to-current converter and the current-to-voltage converter are established so that the potential difference between the control electrodes of the first and second transistors is held constant independently of the voltage of the input signal. Therefore a push-pull drive operation by the first and second transistors can be achieved in accordance with the input signal.

Accordingly, an object of the present invention is to provide a class-AB push-pull drive circuit having a wide operating range of an output voltage.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
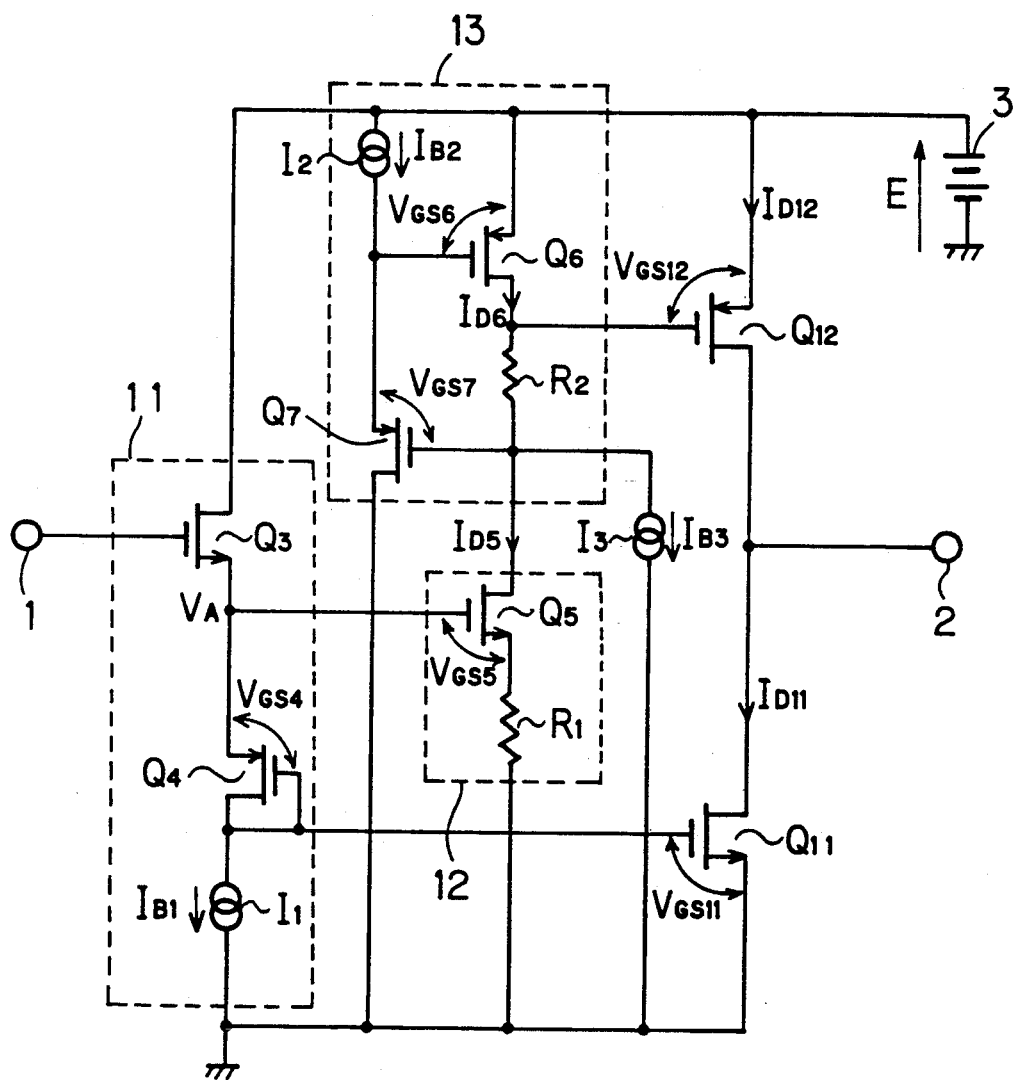
FIG. 1 is a circuit diagram showing one preferred embodiment of a class-AB push-pull drive circuit according to the present invention.

FIG. 1 is a circuit diagram showing one preferred embodiment of a class-AB push-pull drive circuit according to the present invention. The class-AB push-pull drive circuit comprises a buffer circuit 11, a voltage-to-current converter 12 and a current-to-voltage converter 13.

The buffer circuit 11 is composed of an N channel MOS transistor $Q_3$, a P channel MOS transistor $Q_4$ and a constant current source $I_1$. The gate of the transistor $Q_3$ is connected to an input terminal 1, the source thereof is connected to the source of the transistor $Q_4$, and the drain thereof is connected to the positive side of a DC power source 3. The gate and drain of the transistor $Q_4$ are grounded in common. The common gate and drain of the transistor $Q_4$ are connected to the gate of an N channel MOS transistor $Q_{11}$ and grounded through the constant current source $I_1$.

The current-to-voltage converter 12 is composed of an N channel MOS transistor $Q_5$ and a resistor $R_1$. The gate of the transistor $Q_5$ is connected to the source of the transistor $Q_3$ in the buffer circuit 11, and the source thereof is grounded through the resistor $R_1$.

The current-to-voltage converter 13 is composed of P channel MOS transistors $Q_6$ and $Q_7$, a constant current source $I_2$, and a resistor $R_2$. The source of the transistor $Q_6$ is connected to the positive side of the DC power source 3, and the drain thereof is connected to the gate of a P channel MOS transistor $Q_{12}$ and to one end of the resistor $R_2$. The other end of the resistor $R_2$ is connected to the gate of the transistor $Q_7$ and to the drain of the transistor $Q_5$ in the voltage-to-current converter 12 and is grounded through a constant current source $I_3$. The source of the transistor $Q_7$ is connected to the gate of the transistor $Q_6$ and to the positive side of the DC power source 3 through the constant current source $I_2$, with the drain thereof grounded.

The drain of the transistor $Q_{11}$ is connected to an output terminal 2, and the source thereof is grounded. The drain of the transistor $Q_{12}$ is connected to the output terminal 2, and the source thereof is connected to the positive side of the DC power source 3. The negative side of the DC power source 3 is grounded.

In this preferred embodiment, the P channel transistor $Q_{12}$ is provided between the output terminal 2 and the DC power source 3 and the N channel transistor $Q_{11}$ is provided between the output terminal 2 and the ground as drive transistors in an output stage. The buffer circuit 11, the voltage-to-current converter 12 and the current-to-voltage converter 13 are provided so that a potential difference between the bases of the transistors $Q_{11}$ and $Q_{12}$ is held constant at all times independently of the input voltage of the input terminal 1. The buffer circuit 11 converts an input signal with high impedance into a signal with low impedance and supplies the gate of the transistor $Q_{11}$ with voltage corresponding to the input voltage of the input terminal 1. The current-to-voltage converter 12 generates current corresponding to the input voltage. This current is converted into voltage again by the current-to-voltage converter 13, which outputs such voltage that decreases (or increases) a gate-source voltage $V_{GS12}$ of the transistor $Q_{12}$ correspondingly when the input voltage is increased (or decreased) and a gate-source voltage $V_{GS11}$ of the transistor $Q_{11}$ is increased (or decreased). Thereby $(V_{GS11}+V_{GS12})$ is held constant at all times, and the potential difference between the gates of the transistors $Q_{11}$ and $Q_{12}$ (i.e., $E-(V_{GS11}+V_{GS12})$) is also held constant at all times.

If a gate-source voltage of the transistor $Q_4$ is designated by $V_{GS4}$, a drain current thereof by $I_{B1}$ (a bias current from the constant current source $I_1$), the gate-source voltage of the transistor $Q_{11}$ by $V_{GS11}$, a drain current thereof by $I_{D11}$, a gate-source voltage of the transistor $Q_5$ by $V_{GS5}$, a drain current thereof by $I_{D5}$, a gate-source voltage of the transistor $Q_7$ by $V_{GS7}$, a drain current thereof by $I_{B2}$ (a bias current from the constant current source $I_2$), a gate-source voltage of the transistor $Q_6$ by $V_{GS6}$, a drain current thereof by $I_{D6}$, the gate-source voltage of the transistor $Q_{12}$ by $V_{GS12}$, a drain current thereof by $I_{D12}$, a gate potential of the transistor $Q_5$ by $V_A$, and a bias current from the constant current source $I_3$ by $I_{B3}$, the following equations hold:

$$I_{B1} = \frac{\beta_4}{2}(V_{GS4} - V_{THOP})^2 \quad (13)$$

$$I_{D11} = \frac{\beta_{11}}{2}(V_{GS11} - V_{THON})^2 \quad (14)$$

$$I_{D5} = \frac{\beta_5}{2}(V_{GS5} - V_{THON})^2 \quad (15)$$

$$I_{D6} = I_{D5} + I_{B3}$$
$$= \frac{\beta_6}{2}(V_{GS6} - V_{THOP})^2 \quad (16)$$

$$I_{B2} = \frac{\beta_7}{2}(V_{GS7} - V_{THOP})^2 \quad (17)$$

$$I_{D12} = \frac{\beta_{12}}{2}(V_{GS12} - V_{THOP})^2 \quad (18)$$

$$V_A = V_{GS4} + V_{GS11} \quad (19)$$

$$= V_{GS5} + R_1 I_{D5} \quad (20)$$

where $\beta_4$ is a constant determined by the configuration of the transistor $Q_4$, $\beta_{11}$ is a constant determined by the configuration of the transistor $Q_{11}$, $\beta_5$ is a constant determined by the configuration of the transistor $Q_5$, $\beta_6$ is a constant determined by the configuration of the transistor $Q_6$, $\beta_7$ is a constant determined by the configuration of the transistor $Q_7$, $\beta_{12}$ is a constant determined by the configuration of the transistor $Q_{12}$, $V_{THON}$ is a threshold voltage of the N channel transistors, and $V_{THOP}$ is a threshold voltage of the P channel transistors.

From the equations (19) and (20), the following equations hold:

$$I_{D5} = \frac{V_{GS11} + V_{GS4} - V_{GS5}}{R_1} \quad (21)$$

$$V_{GS12} = V_{GS6} + V_{GS7} - R_2 I_{D6} \quad (22)$$

where $R_1$ and $R_2$ are resistance values of the resistors $R_1$ and $R_2$, respectively.

Here, $I_{D6} = I_{D5} + I_{B3}$, and thereby the following equation is obtained from the equations (21) and (22):

$$V_{GS12} = V_{GS6} + V_{GS7} - (R_2/R_1) \cdot (V_{GS11} + V_{GS4} - V_{GS5}) - R_2 I_{B3} \quad (23)$$

On the other hand, the equations (13) to (18) are transformed into the following equations:

$$V_{GS4} = \sqrt{\frac{2I_{B1}}{\beta_4}} + V_{THOP} \quad (24)$$

$$V_{GS11} = \sqrt{\frac{2I_{D11}}{\beta_{11}}} + V_{THON} \quad (25)$$

$$V_{GS5} = \sqrt{\frac{2I_{D5}}{\beta_5}} + V_{THON} \quad (26)$$

$$V_{GS6} = \sqrt{\frac{2I_{D6}}{\beta_6}} + V_{THOP}$$
$$= \sqrt{\frac{2(I_{D5} + I_{B3})}{\beta_6}} + V_{THOP} \quad (27)$$

$$V_{GS7} = \sqrt{\frac{2I_{B2}}{\beta_7}} + V_{THOP} \quad (28)$$

$$V_{GS12} = \sqrt{\frac{2I_{D12}}{\beta_{12}}} + V_{THOP} \quad (29)$$

Letting $R_1 = R_2$ for simplification, the equation (23) can be transformed into the following equation:

$$V_{GS11} + V_{GS12} = V_{GS6} + V_{GS7} - V_{GS4} + V_{GS5} - R_2 I_{B3} \quad (30)$$

Since $I_{B1}$ and $I_{B2}$ are constant bias currents supplied from the constant current sources $I_1$ and $I_2$ respectively, $V_{GS4}$ and $V_{GS7}$ are constant from the equations (24) and (28). Assuming that the change of $I_{D5}$ is small, $V_{GS5}$ and $V_{GS6}$ are approximately constant from the equations (26) and (27). By setting $R_2 I_{B3}$ appropriately, $(V_{GS11} + V_{GS12})$ can be held constant at all times. The potential difference between the gates of the transistors $Q_{11}$ and $Q_{12}$, which is $E-(V_{GS11}+V_{GS12})$, can be held constant at all times by holding $(V_{GS11}+V_{GS12})$ constant.

When the equations (24) to (29) are substituted in the equation (17), the following equation holds:

$$\sqrt{\frac{2I_{D12}}{\beta_{12}}} + V_{THOP} = \sqrt{\frac{2(I_{D5} + I_{B3})}{\beta_6}} + V_{THOP} + \qquad (31)$$

$$\sqrt{\frac{2I_{B2}}{\beta_7}} + V_{THOP} - \frac{R_2}{R_1}\left(\sqrt{\frac{2I_{D11}}{\beta_{11}}} + V_{THON} + \right.$$

$$\left.\sqrt{\frac{2I_{B1}}{\beta_4}} + V_{THOP} - \sqrt{\frac{2I_{D5}}{\beta_5}} - V_{THON}\right) - R_2 I_{B3}$$

Letting $R_1 = R_2$ for simplification as described above, the following equation holds:

$$\sqrt{\frac{2I_{D12}}{\beta_{12}}} = \sqrt{\frac{2(I_{D5} + I_{B3})}{\beta_6}} + \sqrt{\frac{2I_{B2}}{\beta_7}} - \qquad (32)$$

$$\sqrt{\frac{2I_{D11}}{\beta_{11}}} - \sqrt{\frac{2I_{B1}}{\beta_4}} + \sqrt{\frac{2I_{D5}}{\beta_5}} - R_2 I_{B3}$$

Accordingly, $$\sqrt{\frac{2I_{D12}}{\beta_{12}}} + \sqrt{\frac{2I_{D11}}{\beta_{11}}} = \sqrt{\frac{2(I_{D5} + I_{B3})}{\beta_6}} + \qquad (33)$$

$$\sqrt{\frac{2I_{D5}}{\beta_5}} + \sqrt{\frac{2I_{B2}}{\beta_7}} - \sqrt{\frac{2I_{B1}}{\beta_4}} - R_2 I_{B3}$$

Assuming that the change of $I_{D5}$ is small as above-mentioned, $$\sqrt{\frac{2I_{D12}}{\beta_{12}}} + \sqrt{\frac{2I_{D11}}{\beta_{11}}} = \text{const.} \qquad (34)$$

can be obtained because the value on the right side of the equation (33) is approximately constant.

If current which flows from the drain of the transistor $Q_2$ to the drain of the transistor $Q_1$, while no load current is present in the output terminal 2, is designated by $I_{idle}$, $I_{idle} = I_{D11} = I_{D12}$ and the following equation holds from the equation (33):

$$I_{idle} = \left(\frac{\sqrt{\frac{2(I_{D5} + I_{B3})}{\beta_6}} + \sqrt{\frac{2I_{D5}}{\beta_5}} + \sqrt{\frac{2I_{B2}}{\beta_7}} - \sqrt{\frac{2I_{B1}}{\beta_4}} - R_2 I_{B3}}{\sqrt{\frac{2}{\beta_{12}}} + \sqrt{\frac{2}{\beta_{11}}}}\right)^2 \qquad (35)$$

This current value can be held sufficiently small by increasing $R_2 I_{B3}$.

When a load is connected to the output terminal 2 and an outflow current $I_{source}$ is present, the gate-source voltage $V_{GS12}$ of the transistor $Q_{12}$ is increased. In such a case, because the potential difference between the gates of the transistors $Q_{11}$ and $Q_{12}$ is approximately constant, as expressed by the equation (30), the gate-source voltage $V_{GS11}$ of the transistor $Q_{11}$ is decreased and, as a result, the drain current $I_{D11}$ of the transistor $Q_{11}$ is decreased.

Figure 3:
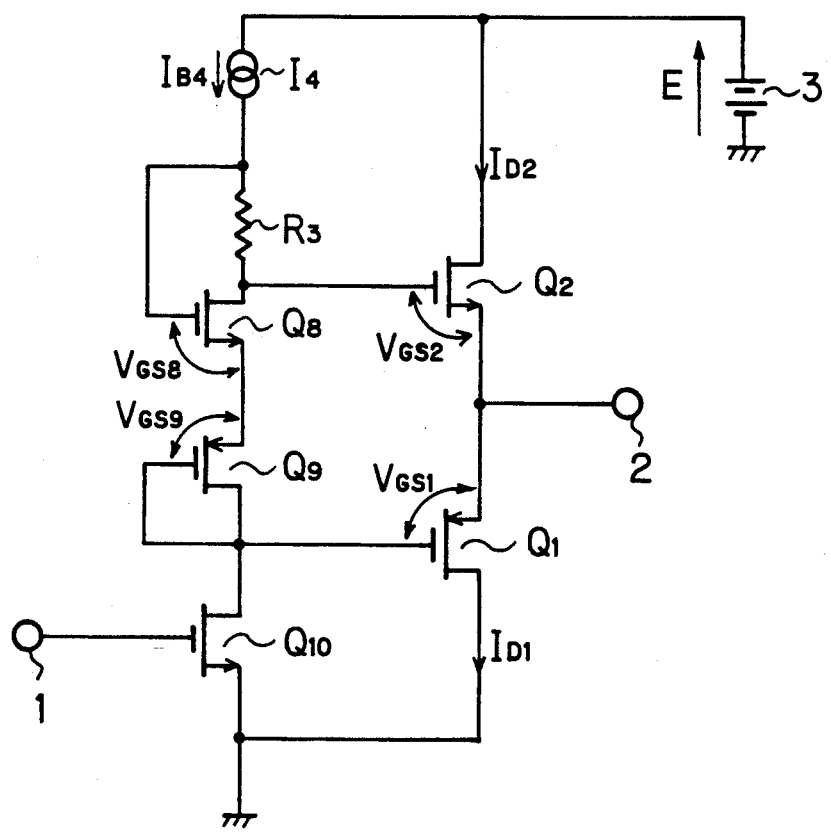
FIG. 3 is a circuit diagram showing a conventional class-AB push-pull drive circuit.

In this state, an increasable maximum voltage $V_{2max}$ of the output terminal 2 can be expressed by the following equation:

$$V_{2max} = E - V_{12SAT} \qquad (36)$$

where $V_{12SAT}$ is a saturation voltage of the transistor $Q_{12}$. This saturation voltage $V_{12SAT}$ can be sufficiently small (e.g., 0.2 V or less). Hence, according to the drive circuit of this preferred embodiment, the voltage is operable up to a value much higher than the maximum voltage of the conventional circuit of FIG. 3 expressed by the equation (10).

When load is connected to the output terminal 2 and an inflow current $I_{sink}$ is present, the gate-source voltage $V_{GS11}$ of the transistor $Q_{11}$ is increased. In such a case, because the potential difference between the gates of the transistors $Q_{11}$ and $Q_{12}$ is approximately constant as expressed by the equation (30), the gate-source voltage $V_{GS12}$ of the transistor $Q_{12}$ is decreased and, as a result, the drain current $I_{D12}$ of the transistor $Q_{12}$ is decreased.

In this state, a decreasable minimum voltage $V_{2min}$ of the output terminal 2 can be expressed by the following equation:

$$V_{2min} = V_{11SAT} \qquad (37)$$

where $V_{11SAT}$ is a saturation voltage of the transistor $Q_{11}$. This saturation voltage $V_{11SAT}$ can be sufficiently small (e.g., 0.2 V or less). Hence, according to the drive circuit of this preferred embodiment, the voltage is operable to a value much lower than the minimum voltage of the conventional circuit of FIG. 3 expressed by the equation (12).

According to this preferred embodiment, the attainable maximum and minimum output voltages of the output terminal 2 are $(E-0.2)V$ and 0.2 V respectively, and thus an advantage is that the operating range of the output voltage is sufficiently wide in comparison with the conventional circuit.

Figure 2:
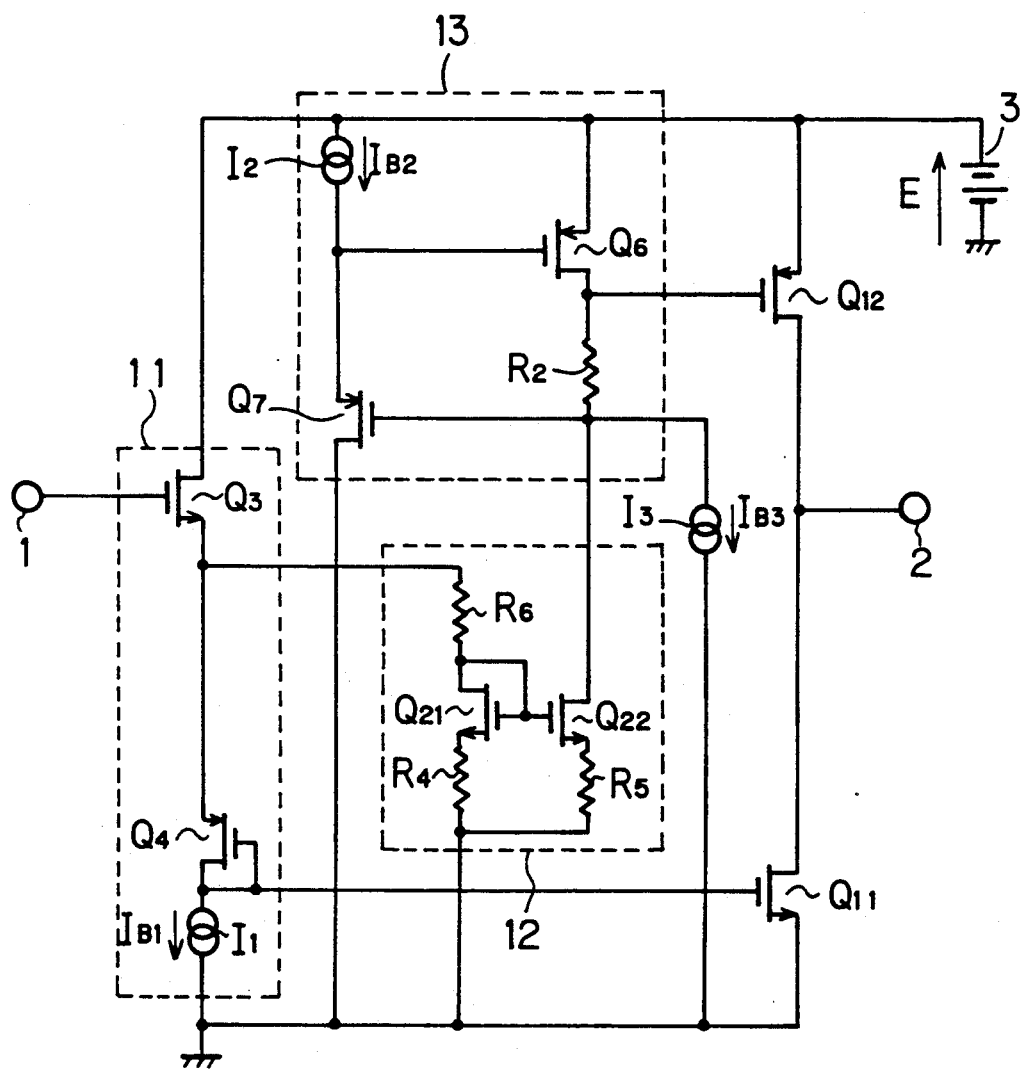
FIG. 2 is a circuit diagram showing another preferred embodiment of the class-AB push-pull drive circuit according to the present invention.

FIG. 2 is a circuit diagram showing another preferred embodiment of the class-AB push-pull drive circuit according to the present invention. In this preferred embodiment, the voltage-to-current converter 12 comprises resistors $R_4$ to $R_6$ and a current mirror circuit composed of N channel MOS transistors $Q_{21}$ and $Q_{22}$. The gate and drain of the transistor $Q_{21}$ are connected in common, and the common junction is connected through the resistor $R_6$ to the source of the transistor $Q_3$ in the buffer circuit 11. The source of the transistor $Q_{21}$ is grounded through the resistor $R_4$. The gate of the transistor $Q_{22}$ is connected to the gate of the transistor $Q_{21}$, the drain thereof is connected to the common junction of the resistor $R_2$ and the gate of the transistor $Q_7$ in the current-to-voltage converter 13, and the source thereof is grounded through the resistor $R_5$. Other structure of this preferred embodiment is similar to that of the circuit of FIG. 1.

In the circuit structure according to this preferred embodiment, the gate voltage of the transistor $Q_{22}$ is adapted to be decreased so that the transistor $Q_{22}$ connected to the current-to-voltage converter 13 can be operated on a lower power voltage in comparison with the transistor $Q_5$ in the circuit of FIG. 1.

In the above-mentioned preferred embodiments, conversion characteristics of the voltage-to-current converter 12 and the current-to-voltage converter 13 are established so that the increase (or decrease) in the input voltage causes the current in the voltage-to-current converter 12 to increase (or decrease) and accordingly the output voltage of the current-to-voltage converter 13 supplied with that current decreases (or increases) the gate-source voltage $V_{GS12}$ of the transistor $Q_{12}$. However, the conversion characteristics of the voltage-to-current converter 12 and the current-to-voltage converter 13 may be established so that the increase (or decrease) in the input voltage causes the current in the voltage-to-current converter 12 to decrease (or increase) and accordingly the output voltage of the current-to-voltage converter 13 supplied with that current decreases (or increases) the gate-source voltage $V_{GS12}$ of the transistor $Q_{12}$.

Furthermore, in the above-mentioned preferred embodiments, the drive circuit may be constituted so that, by reversing the potential E of the DC power source 3 and the ground potential, the respective transistors $Q_3$ to $Q_7$, $Q_{11}$, $Q_{12}$, $Q_{21}$ and $Q_{22}$ are reversed in polarity of P and N channels.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A class-AB push-pull drive circuit, comprising:
    first and second power terminals for applying different first and second power potentials, respectively;
    input and output terminals supplied with input and output signals, respectively;
    a first transistor one electrode of which is connected to said output terminal, the other electrode of which is connected to said first power terminal, and a control electrode of which is coupled to said input terminal and is supplied with voltage corresponding to voltage of said input signal, conduction of the first transistor being controlled in accordance with a potential difference between the control electrode thereof and the other electrode thereof;
    a second transistor opposite in polarity to said first transistor, one electrode of which is connected to said output terminal, and the other electrode of which is connected to said second power terminal, conduction of the second transistor being controlled in accordance with a potential difference between a control electrode thereof and the other electrode thereof;
    a voltage-to-current converter coupled to said input terminal for generating current corresponding to the voltage of said input signal; and
    a current-to-voltage converter connected between an output of said voltage-to-current converter and the control electrode of said second transistor for converting said current into voltage to supply the voltage to the control electrode of said second transistor,
    wherein conversion characteristics of said voltage-to-current converter and said current-to-voltage converter are established so that a potential difference between the control electrodes of said first and second transistors is held constant independently of the voltage of said input signal.

2. A class-AB push-pull drive circuit in accordance with claim 1, further comprising
    a buffer circuit connected between said input terminal and said control electrode of said first transistor as well as said voltage-to-current converter for buffering said input signal to supply the input signal to said control electrode of said first transistor and said voltage-to-current converter.

3. A class-AB push-pull drive circuit in accordance with claim 2, wherein
    said buffer circuit comprises a third transistor having one electrode connected with said second power terminals, the other electrode connected with said voltage-to-current converter and a control electrode connected with said input terminal.

4. A class-AB push-pull drive circuit in accordance with claim 3, wherein
    said buffer circuit further comprises a constant current source and a fourth transistor having one electrode connected with said first power terminal through said constant current source, the other electrode connected with said other electrode of said third transistor and a control electrode connected with said other electrode of oneself and said control electrode of said first transistor.

5. A class-AB push-pull drive circuit in accordance with claim 1, wherein
    said voltage-to-current converter comprises a resistor and a third transistor having one electrode connected with said current-to-voltage converter, the other electrode connected with said first power terminal through said resistor and a control electrode coupled with said input terminal.

6. A class-AB push-pull drive circuit in accordance with claim 1, wherein
    said voltage-to-current converter comprises a first resistor, a third transistor having one electrode coupled with said input terminal through said first resistor, the other electrode coupled with said first power terminal and a control electrode connected with said one electrode of oneself, and a fourth transistor having one electrode connected with said current-to-voltage converter, the other electrode coupled with said first power terminal and a control electrode connected with said control electrode of said third transistor.

7. A class-AB push-pull drive circuit in accordance with claim 6, wherein
    said voltage-to-current converter further comprises a second resistor connected between said other electrode of said third transistor and said first power terminal and a third resistor connected between said other electrode of said fourth transistor and said first power terminal.

8. A class-AB push-pull drive circuit in accordance with claim 1, wherein
    said current-to-voltage converter comprises a resistor, a third transistor having one electrode connected with said voltage-to-current converter through said resistor, the other electrode connected with said second power terminal and a control electrode, and a fourth transistor having one electrode connected with said first power terminal, the other electrode connected with said control electrode of said third transistor and a control electrode connected with said voltage-to-current converter.

9. A class-AB push-pull drive circuit in accordance with claim 8, wherein
said current-to-voltage converter further comprises a constant current source connected between said control electrode of said third transistor and said second power source.

10. A class-AB push-pull drive circuit in accordance with claim 9, further comprising
another constant current source connected between said control electrode of said fourth transistor and said first power terminal.

* * * * *